United States Patent
Lilak et al.

(10) Patent No.: US 10,497,781 B2
(45) Date of Patent: Dec. 3, 2019

(54) METHODS FOR DOPING A SUB-FIN REGION OF A SEMICONDUCTOR STRUCTURE BY BACKSIDE REVEAL AND ASSOCIATED DEVICES

(71) Applicant: Intel Corporation, Santa Clara, CA (US)

(72) Inventors: Aaron D. Lilak, Beaverton, OR (US); Stephen M. Cea, Hillsboro, OR (US); Rishabh Mehandru, Portland, OR (US); Cory E. Weber, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/774,952

(22) PCT Filed: Dec. 23, 2015

(86) PCT No.: PCT/US2015/000479
§ 371 (c)(1),
(2) Date: May 9, 2018

(87) PCT Pub. No.: WO2017/111864
PCT Pub. Date: Jun. 29, 2017

(65) Prior Publication Data
US 2018/0248005 A1      Aug. 30, 2018

(51) Int. Cl.
*H01L 29/10* (2006.01)
*H01L 21/324* (2006.01)
(Continued)

(52) U.S. Cl.
CPC .... *H01L 29/1083* (2013.01); *H01L 21/26566* (2013.01); *H01L 21/304* (2013.01);
(Continued)

(58) Field of Classification Search
CPC ............. H01L 29/1083; H01L 29/7851; H01L 29/167; H01L 21/304; H01L 21/26566;
(Continued)

(56) References Cited

U.S. PATENT DOCUMENTS

2013/0062699 A1   3/2013   Zhu et al.
2014/0159126 A1   6/2014   Wei et al.
(Continued)

OTHER PUBLICATIONS

International Search Report and Written Opinion dated Aug. 24, 2016 for International Application No. PCT/US2015/000479, 10 pages.

*Primary Examiner* — Jasmine J Clark
(74) *Attorney, Agent, or Firm* — Schwabe, Williamson & Wyatt, P.C.

(57) ABSTRACT

Methods for doping a sub-fin region of a semiconductor structure include providing a semiconductor structure that comprises a substrate and a plurality of fins formed on the substrate, the plurality of fins having sub-fin regions adjacent to the substrate; removing the substrate to expose a portion of the sub-fin regions of the plurality of fins, and implanting a dopant material into the exposed portion of the sub-fin region. The method may also include performing an annealing process after the implantation such that the dopant becomes electrically active. The method may also include patterning the backside of the semiconductor structure. Devices constructed using the disclosed methods are also provided, and other embodiments are discussed.

25 Claims, 9 Drawing Sheets

(51) Int. Cl.
*H01L 29/78* (2006.01)
*H01L 29/66* (2006.01)
*H01L 21/265* (2006.01)
*H01L 21/304* (2006.01)
*H01L 21/306* (2006.01)
*H01L 29/167* (2006.01)

(52) U.S. Cl.
CPC ...... *H01L 21/30625* (2013.01); *H01L 21/324* (2013.01); *H01L 29/167* (2013.01); *H01L 29/66795* (2013.01); *H01L 29/785* (2013.01); *H01L 29/7851* (2013.01); *H01L 21/26513* (2013.01)

(58) Field of Classification Search
CPC ......... H01L 21/30625; H01L 29/66795; H01L 29/785; H01L 21/324; H01L 21/26513
See application file for complete search history.

(56) References Cited

U.S. PATENT DOCUMENTS

| | | |
|---|---|---|
| 2014/0264485 A1 | 9/2014 | Li et al. |
| 2014/0332749 A1 | 11/2014 | Yokoyama |
| 2015/0255456 A1 | 9/2015 | Jacob et al. |
| 2016/0056156 A1* | 2/2016 | Ghani ............ H01L 21/823821 257/401 |
| 2016/0329326 A1* | 11/2016 | Balakrishnan ...... H01L 27/0886 |

* cited by examiner

METHODS FOR DOPING A SUB-FIN REGION OF A SEMICONDUCTOR STRUCTURE BY BACKSIDE REVEAL AND ASSOCIATED DEVICES

CROSS REFERENCE TO RELATED APPLICATIONS

The present application is a national phase entry under 35 U.S.C. § 371 of International Application No. PCT/US2015/000479, filed Dec. 23, 2015, entitled "METHODS FOR DOPING A SUB-FIN REGION OF A SEMICONDUCTOR STRUCTURE BY BACKSIDE REVEAL AND ASSOCIATED DEVICES", which designated, among the various States, the United States of America, and which is hereby incorporated by reference in its entirety.

TECHNICAL FIELD

Example embodiments generally relate to the field of semiconductors and more particularly relate to selectively doping a sub-fin region of a semiconductor fin, as well as device structures, devices, and systems formed using such techniques.

BACKGROUND

Three-dimensional (3D) semiconductor devices typically include a thin 3D silicon fin that rises up vertically from a silicon substrate. When the 3D semiconductor device is a tri-gate transistor, the fins usually act as an active channel region of the tri-gate transistor. Such transistors are often referred to as "tri-gate transistors" as the channel is controlled by a gate on three sides. For many applications, it may be desired for a bottom portion of the fins (also referred to as a "sub-fin region") to be doped with one or more dopant materials while a top portion of the fins (also referred to as a "top-fin region" and/or an "active fin region") remains undoped. However, current semiconductor fabrication methods do not provide techniques for doping the sub-fin region without introducing competing carriers into the top-fin region and/or without damaging the fins of the 3D semiconductor structure.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1:
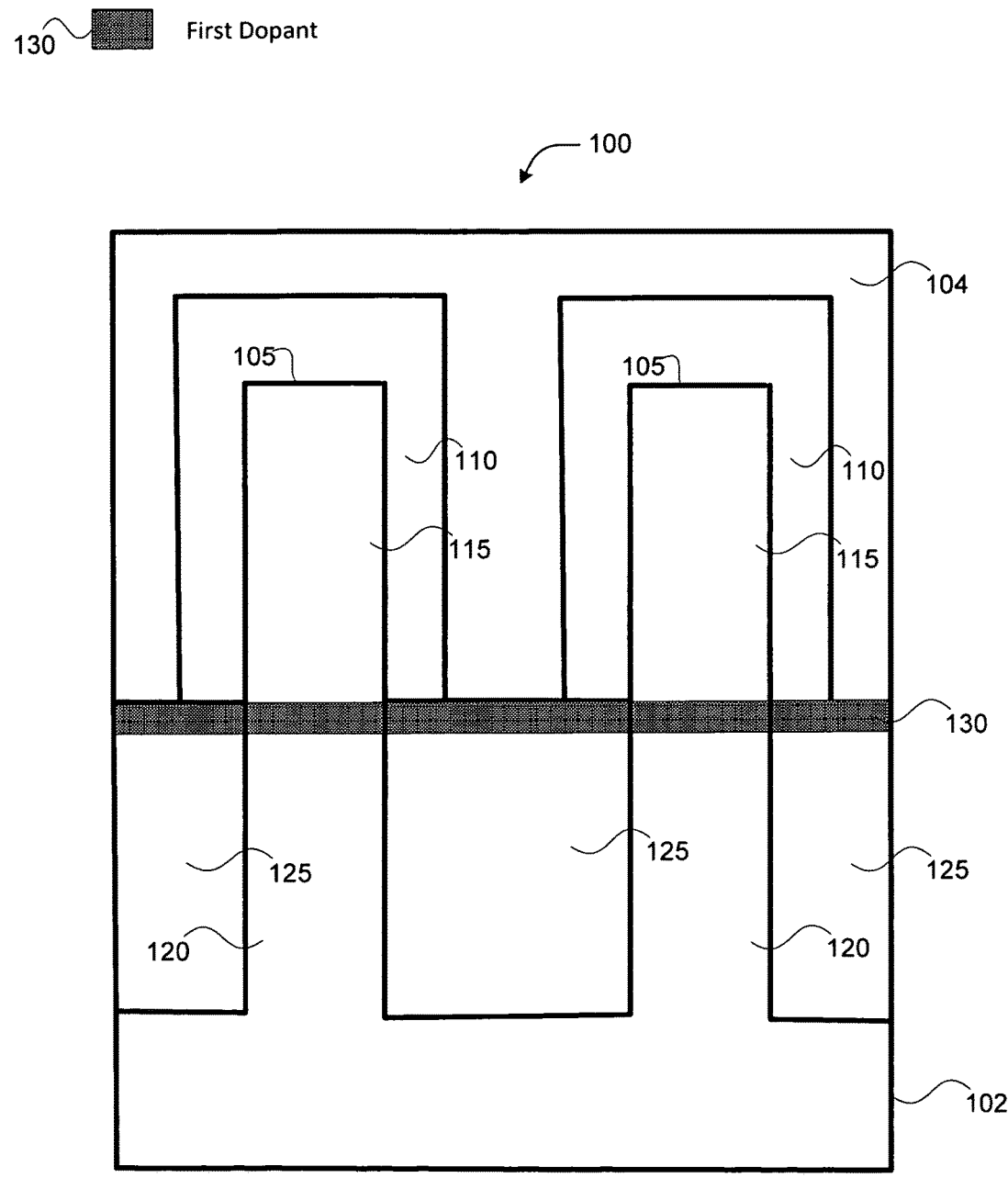
FIG. 1 shows a side cross sectional view of an example semiconductor structure, in accordance with various example embodiments.

One or more embodiments or implementations are now described with reference to the enclosed figures. While specific configurations and arrangements are discussed, it should be understood that this is done for illustrative purposes only. Persons skilled in the relevant art will recognize that other configurations and arrangements may be employed without departing from the spirit and scope of the description. It will be apparent to those skilled in the relevant art that techniques and/or arrangements described herein may also be employed in a variety of other systems and applications other than what is described herein.

Reference is made in the following detailed description to the accompanying drawings, which form a part hereof, wherein like numerals may designate like parts throughout to indicate corresponding or analogous elements. It will be appreciated that for simplicity and/or clarity of illustration, elements illustrated in the figures have not necessarily been drawn to scale. For example, the dimensions of some of the elements may be exaggerated relative to other elements for clarity. Further, it is to be understood that other embodiments may be utilized and structural and/or logical changes may be made without departing from the scope of claimed subject matter. It should also be noted that directions and references, for example, up, down, top, bottom, over, under, and so on, may be used to facilitate the discussion of the drawings and embodiments and are not intended to restrict the application of claimed subject matter. Therefore, the following detailed description is not to be taken in a limiting sense and the scope of claimed subject matter defined by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" means that a particular feature, structure, function, or characteristic described in connection with the embodiment is included in at least one embodiment of the invention. Thus, the appearances of the phrase "in an embodiment" or "in one embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe structural relationships between components. It should be understood that these terms are not intended as synonyms for each other. Rather, in particular embodiments, "connected" may be used to indicate that two or more elements are in direct physical or electrical contact with each other. "Coupled" my be used to indicated that two or more elements are in either direct or indirect (with other intervening elements between them) physical or electrical contact with each other, and/or that the two or more elements co-operate or interact with each other (e.g., as in a cause and effect relationship).

The terms "over," "under," "between," "on", and/or the like, as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features.

As used in throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Methods, device structures, devices, apparatuses, and computing platforms, are described below related to selective and/or conformal doping of a sub-fin region of a semiconductor structure, which may be used for the fabrication of a semiconductor device, such as tri-gate transistors, high aspect ratio devices such as nanowire devices, and/or other like three-dimensional (3D) semiconductor devices. The example embodiments improve performance of semiconductor devices by providing active isolation of the sub-fin region of one or more semiconductor fins without introducing competing carriers into an active fin region of the semiconductor fins. Moreover, the example embodiments allow for more abrupt dopant profiles and may reduce overall damage to the semiconductor fins by reducing and/or eliminating the use of traditional implantation processes.

Conventional methods for doping a sub-fin region typically include performing a low-energy implant process to a free-standing semiconductor fin structure. Such processes may be capable of introducing a dopant to provide gate control, but tend to be incapable of providing doping to control leakage deep in the sub-fin region of the semiconductor fin structure. Other conventional methods include performing a high-energy implant process, which may be performed with a dielectric layer (such as region 125 in FIG. 1) flush or nearly flush with the top of the fins and prior to patterning and forming the gate. Such processes may introduce dopant near the bottom of the trench (i.e., to a bottom portion of the sub-fin region). However, since high energy is used, such processes frequently introduce dopant directly into the active channel and laterally into adjacent devices. Other conventional methods include performing a solid-source in-diffusion process where a doped silicate glass, oxynitride, or doped semi-conductor is deposited and annealed to drive the dopant into the sub-fin region. Such processes present numerous integration challenges, which are addressed by the various example embodiments disclosed herein.

The techniques discussed herein may provide a simplified fabrication process for forming semiconductor fins with doped sub-fin regions. Such doped sub-fin regions may eliminate fabrication steps that would otherwise cause complication, variability in processing, and/or damage to the semiconductor fin (e.g., channel regions and/or source/drain regions of the fin). Further, the techniques disclosed herein may reduce the introduction of dopants directly into an active channel and/or adjacent devices. Moreover, the example embodiments may provide solid thin film dopant layers that may allow for the creation of relatively shallow and/or abrupt dopant profiles that are not possible with conventional implant and/or flowable oxides or oxynitrides containing dopant atoms. Furthermore, devices formed using such techniques may provide enhanced performance and reduced cost of manufacture.

FIG. 1 shows a side cross sectional view of the example semiconductor structure 100 of FIG. 1, in accordance with various example embodiments. As shown, the semiconductor structure 100 may include at least two semiconductor fins 105, each of which may include a gate 110 formed thereon. The semiconductor structure 100 may further include a substrate 102 from which the two semiconductor fins 105 may be formed or patterned. In other embodiments, the semiconductor structure 100 may include three or more fins 105 (not shown). Each of the fins 105 may be laterally separated from each other fin 105, and each of the fins 105 may extend away from the substrate 102. In various embodiments, the fins 105 and substrate 102 may include a semiconductor material such as monocrystalline silicon (Si), silicon-on-insulator ("SOI"), germanium (Ge), a III-V materials based material (e.g., gallium arsenide (GaAs)), a silicon carbide (SiC), a sapphire ($Al_2O_3$), silicon germanium (SiGe), indium antimonide (InSb), lead telluride (PbTe), indium arsenide (InAs), indium phosphide (InP), gallium antimonide (GaSb), and the like, or any combination thereof. The fins 105 may be formed using any suitable technique or techniques such as using a patterning and etch process of substrate 102 and/or the like. In some examples, fins 105 may be used for tri-gate transistor devices. In other examples, fins 105 may be an undercut fin to be used for nanowire devices. The fins 105 may include a top-fin region 115 and a sub-fin region 120. Lengths of the top-fin region 115 and the sub-fin region 120 may be application specific and may be chosen based on one or more design choices.

The gate 110 may be formed on or adjacent to a top surface of each fin 105 and on or adjacent to opposing sidewalls of each fin 105 (not shown). In other embodiments, each gate 110 may be fabricated by forming the gate dielectric layer 104 (not shown) on the top surface of a fin 105 (not shown). A gate electrode (not shown) may be formed on or adjacent the gate dielectric layer 104. In some embodiments, the fin 105 may run in a direction substantially perpendicular to the gate 110 (not shown). The gate dielectric layer 104 may be formed from any well-known gate dielectric material, including but not limited to silicon dioxide ($SiO_2$), silicon oxynitride ($SiO_xN_y$), silicon nitride ($Si_3N_4$), and high-k dielectric materials such as hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. The gate dielectric layer 104 can be formed by well-known techniques, such as by conformally depositing a gate dielectric material and then patterning the gate dielectric material with well-known photolithography and etching techniques, as will be understood to those skilled in the art.

In various embodiments, the gate 110 may be formed by various methods, according to a particular application and/or one or more design choices. A source region and a drain region (not shown) may be formed in the fins 105 on opposite sides of the gate electrode. In one embodiment, the source and drain regions may be formed by doping the fins 105, as will be understood to those skilled in the art. In another embodiment, the source and drain regions may be formed by removing portion of the fins 105 and replacing these portions with appropriate materials(s) to form the source and drain regions, as will be understood to those skilled in the art. In another embodiment, the source and drain regions may be formed by exitaxially growing doped or undoped strain layers on the fins 105. Other methods or combination of methods may be utilized to form the source/drain regions, according to the particular application and/or one or more design choices.

The semiconductor structure 100 may include a dielectric layer 125 on the sub-fin region 120 and/or substrate 102 (e.g., such that the sub-fin region 120 is covered by the dielectric layer 125). The type of dielectric material used for the dielectric layer 125 used may be application specific. In various embodiments, the dielectric layer 125 may be an oxide material, such as silicon oxide (SiO), silicon dioxide ($SiO_2$), and/or any other suitable oxide or oxy-nitride material. The oxide material may be formed using any known technique for forming oxide material on a semiconductor structure, such as by performing a spin-on procedure or a spin coating operation, or the oxide material may be formed by performing a suitable geometrically selective deposition process, wherein the oxide material is grown from the surface of the substrate 102 towards the top-fin region 115 without covering the surface of the top-fin region 115. In some embodiments, the dielectric layer 125 may be a reflowable silicon oxide material and/or any other like reflowable film. In such embodiments, the dielectric layer 125 may be applied by a spin-on operation or a spin coating operation where the semiconductor structure 100 is placed on a spinning apparatus (also referred to as a "spinner"), and a desired amount of the dielectric material 125 is dropped on the semiconductor structure 100 while it is spinning. A thickness or size of the dielectric layer 125 may be application specific. In another embodiment the dielectric material 125 is deposited to a height above or equal to the top of the fin and then recessed via a suitable etch process.

Furthermore, the semiconductor structure 100 may optionally include a first dopant 130 in the sub-fin region 120. The first dopant 130 may comprise any suitable material, such as boron (B), phosphorus (P), arsenic (As), antimony (Sb), indium (In), carbon (C), silicon (Si), germanium (Ge), fluorine (F) a combination of two or more of B, P, As, Sb, In, C, Si, Ge, F, and/or any other suitable material. A thickness of a region including the dopant 130 may be application specific. The first dopant 130 may be deposited or implanted into the sub-fin region 120 according to known methods. For example, the first dopant 130 may be deposited using any suitable deposition operation, such as a conformal deposition process, which may include implant plasma dopant deposition, atomic layer deposition (ALD), molecular layer deposition (MLD), or chemical vapor deposition (CVD). By way of another example, the first dopant 130 may be implanted using a low-energy implant process, a high-energy implant process that may be performed with the dielectric region 125 flush or nearly flush with the top of the fin prior to formation of the gate, and/or using a solid-source in-diffusion process where a doped silicate glass is annealed to implant the first dopant material 130 into the sub-fin region 120. Such an annealing process may be any suitable annealing process, such as a spike annealing process, a drive-in annealing process, and the like.

Figure 2:
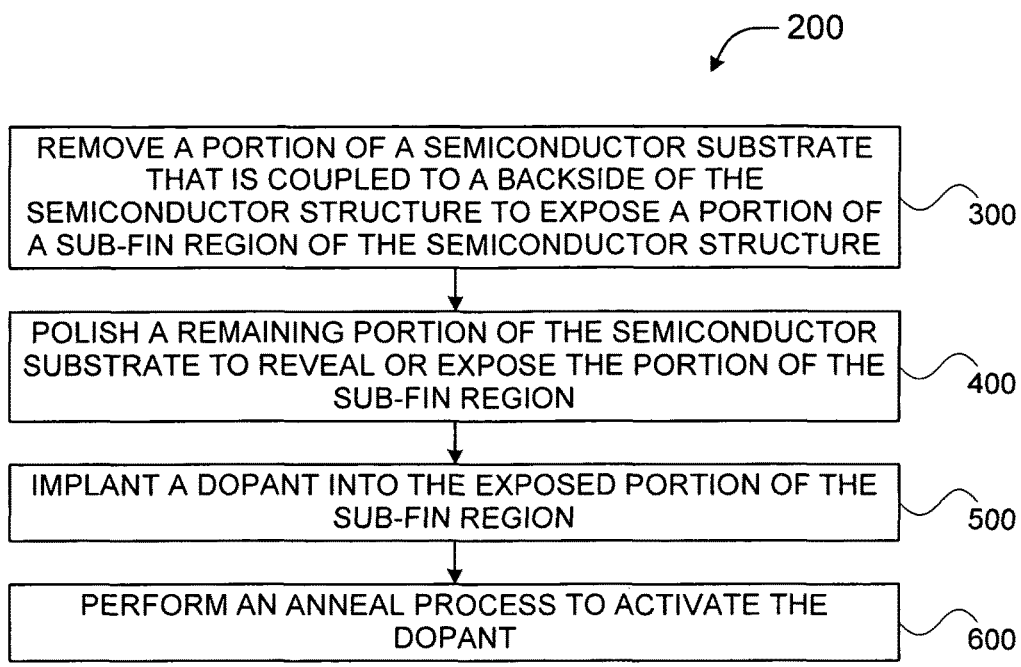
FIG. 2 shows a flow diagram illustrating an example process for selectively doping a sub-fin region of a semiconductor structure, in accordance with various example embodiments.

FIG. 2 shows a flow diagram illustrating an example process 200 for selectively doping a sub-fin region of a semiconductor structure 100, in accordance with various example embodiments. Process 200 may be implemented to fabricate a semiconductor structure 100 as shown by FIGS. 3-6, or any other transistor structures as discussed herein. In the illustrated implementation, process 200 may include one or more operations as illustrated by operations 300-600. FIGS. 3-6 may illustrate the semiconductor structure 100 subsequent to operations 300, 400, 500, and 600 of process 200, respectively. While particular examples and orders of operations are illustrated in FIGS. 3-6, in various embodiments, these operations may be re-ordered, broken into additional operations, combined, and/or omitted altogether without departing from the example embodiments disclosed herein. Furthermore, it should be noted that, because the semiconductor structure 100 shown by FIGS. 1 and 3-6 is a 3D structure, the surfaces of the semiconductor structure 100 may extend horizontally out of the plane shown by FIGS. 1 and 3-6 (e.g., into the page and/or out of the page). Moreover, the example embodiments shown and described with regard to FIGS. 3-6 may also apply to the surfaces of the semiconductor structure 100 that extend horizontally out of the plane shown by FIGS. 1 and 3-6.

Figure 3:
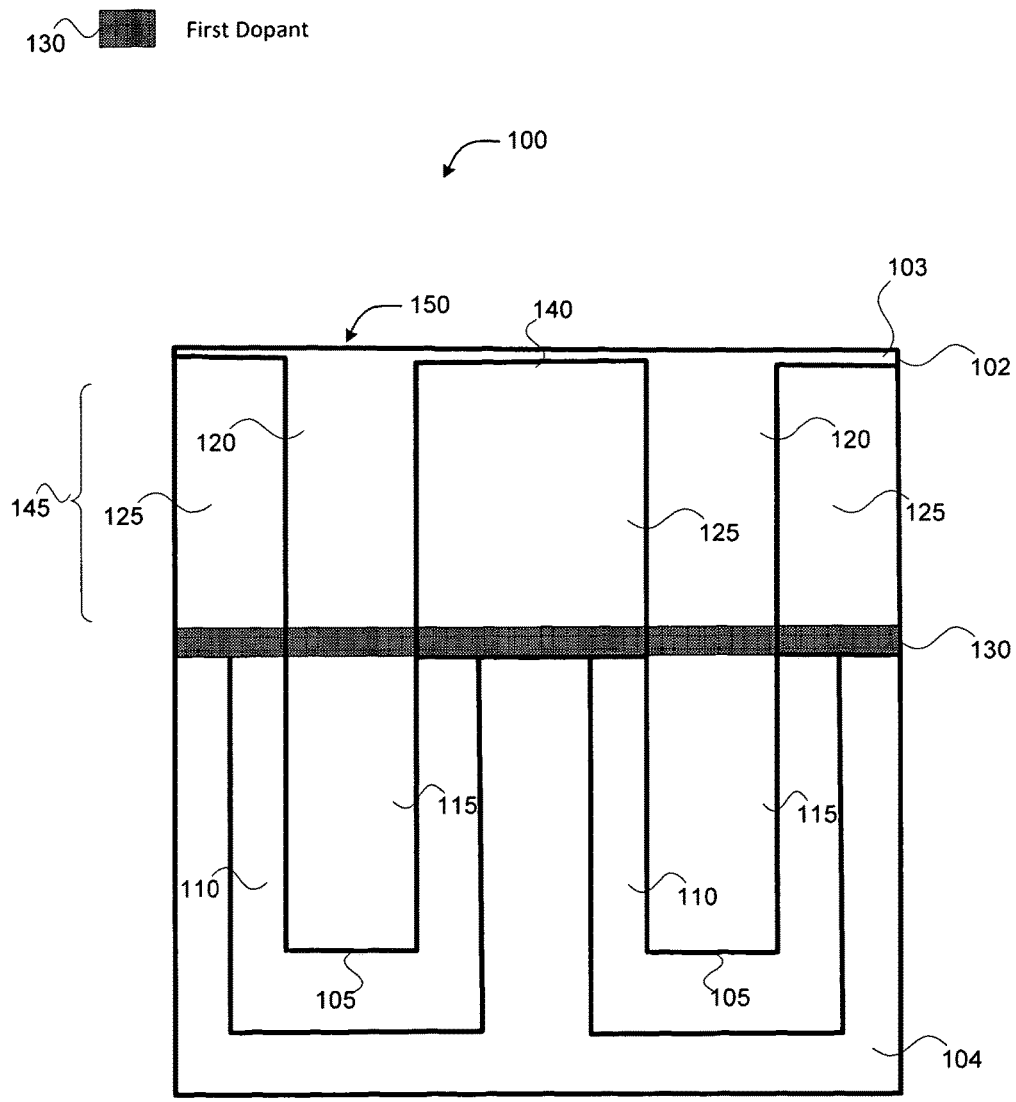
FIGS. 3-6 show cross sectional views of the example semiconductor structure of FIG. 1 as particular fabrication operations are performed according to the process shown by FIG. 2, in accordance with various example embodiments.
Figure 4:
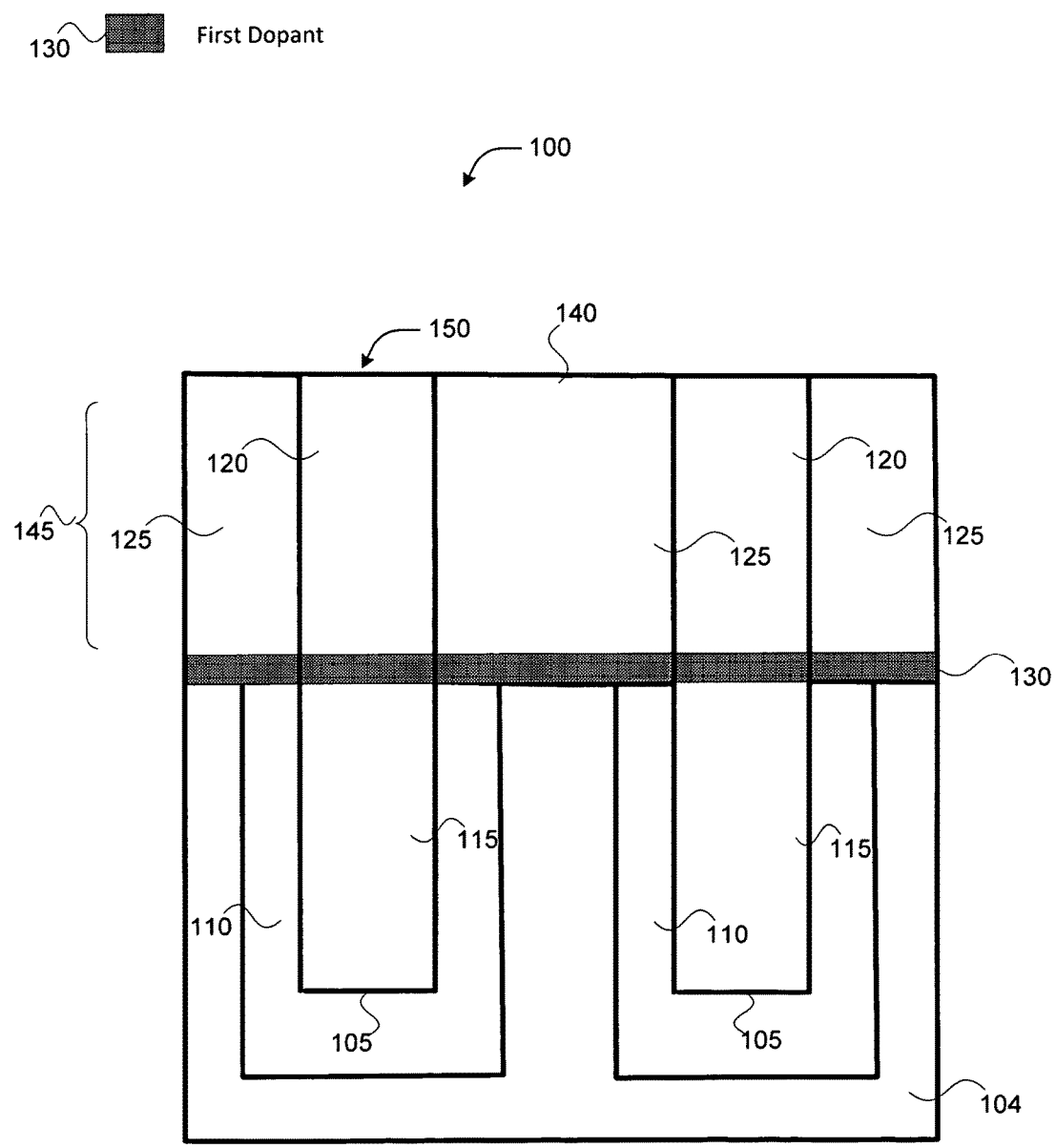

Referring to FIGS. 2 and 3, process 200 may begin at operation 300, to remove a portion of a substrate 102 that is coupled to a backside 150 of the semiconductor structure 100 to expose or nearly expose a portion of a sub-fin region 120 of the semiconductor structure 100. The term "backside" as used herein may refer to a region, area, or side of the semiconductor device 100 on which an insulator layer (e.g., substrate 102) is formed during fabrication of the semiconductor device 100. Referring to FIGS. 2 and 4, the process 200 may proceed to operation 400 to polish a remaining portion 103 of the substrate 102 to reveal or expose a portion of the sub-fin region 120. The exposed (or nearly exposed) portion of a sub-fin region 120 may be a trench bottom 140 of the semiconductor structure 100. The portion of a substrate 102 may be removed according to any suitable recess or reveal operation, such as a wet chemical etching process, a dry etching process, a mechanical grinding operation, and/or chemical mechanical planarization (CMP). In embodiments where wet chemical etching is used, the wet chemical etching process may include a hydrofluoric-acid bath and the like. The wet chemical etching may also include wet anisotropic etching using tetramethylammonium hydroxide (TMAH or $N(CH_3)_4{}^+OH^-$), hydrofluoric (HF) acid, nitric acid, acetic acid, and/or the like. Any suitable method or machinery may be used to perform the wet etching process. For example, the semiconductor structure 100 may be placed in an etching chamber, where the semiconductor substrate 102 is exposed to an etchant (e.g., by a spray tool) to remove the semiconductor substrate 102. In embodiments where wet chemical etching is used, the dry etching process may include plasma etching, plasma ashing, reactive ion etching, ion beam etching, and/or any other etching process described herein. Any suitable method or machinery may be used for the dry etching process. For example, the semiconductor structure 100 may be exposed to ions of a reactive gas or plasma to remove portions of the semiconductor structure 100. The reactive gas or plasma may include fluorocarbons, oxygen, chlorine, boron tricholoride, sulfur hexafluoride, etc., which may be combined with one or more of nitrogen, argon, helium, and the like.

Furthermore, any suitable method or machinery may be used for the mechanical grinding operation. For example, the semiconductor structure 100 may be brought into contact with a rotating grinding wheel. In some embodiments, the semiconductor structure 100 may be placed on a rotating device and rotated in, addition to, or instead of, rotating the grinding wheel. The surface of the grinding wheel may be abrasive and/or otherwise configured to remove the semiconductor material from the substrate layer. Any suitable method or machinery may be used for the CMP operation. For example, the CMP operation may include using an abrasive device and one or more corrosive chemical slurries (also referred to as a "colloid") in conjunction with a polishing pad. The semiconductor structure 100 may be held in place by a retaining device, such as a plastic ring. The polishing pad may be pressed against substrate 102 by a polishing head, which may be rotated with different axes of rotation to partially or completely remove the substrate 102. In various embodiments, the polishing operation at operation 400 may include the aforementioned grinding operation and/or the CMP operation.

The reveal operation may be performed until a layer of the substrate 102 having a desired thickness remains on the semiconductor device 100 (e.g., remaining portion 103) and then polishing the remaining portion 103 of the substrate 102 to expose a portion of the sub-fin region 120, as is shown by FIGS. 3 and 4. For example, at operation 300 a wet chemical etch or dry etch process may be performed until a relatively thin layer of substrate 102 is at a desired thickness remains (FIG. 3), and then at operation 400 a grinding and/or a CMP process may be performed to reveal/expose the portion of the sub-fin region (FIG. 4). In other embodiments, the recess operation may be performed to completely remove the substrate 102 so that a portion of the sub-fin region 120 is exposed, as is shown in FIG. 4. In such embodiments operation 300 may be omitted and at operation 400 a grinding and/or a CMP process may be performed to reveal the portion of the sub-fin region (FIG. 4). Further, as shown by FIG. 4, a surface of the dielectric layer 125 (or oxide material) may also be exposed after the reveal process is performed.

Once the backside 150 of the semiconductor structure 100 is revealed, the process 200 may optionally include performing a patterning process to the exposed portion of the sub-fin region 120 (not shown). The patterning process may include performing one or more suitable etch operations and/or one or more suitable photolithography operations as discussed herein. For example, the patterning operation may be used to form various regions on the semiconductor structure 100 with a resist 510 and/or a mask 515 as shown and described with regard to FIG. 5.

Figure 5:
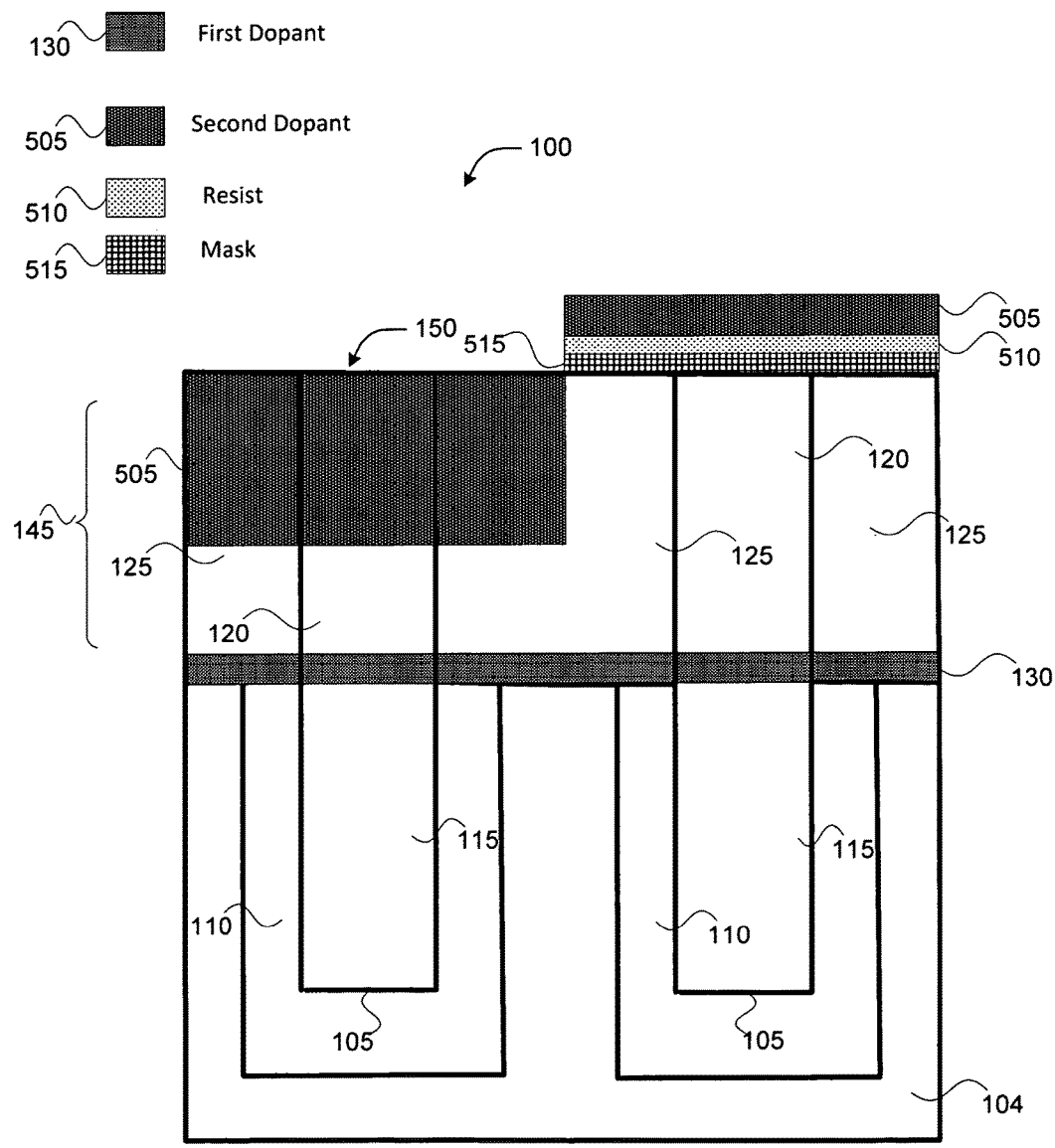

Referring to FIGS. 2 and 5, process 200 may proceed to operation 500, to implant a dopant into the exposed portion of the sub-fin region 120 and/or into the exposed surface of the dielectric layer 125 (for example, the revealed backside 150). The second dopant 505 may comprise any suitable material, such as B, P, As, Sb, In, C, Si, Ge, F, or a combination of two or more of B, P, As, Sb, C, Si, Ge, F, and In, and/or any other suitable dopant atom(s) including the use of molecular clusters such as boron difluoride ($BF_2$). The second dopant material 505 may be the same or similar as the first dopant material 130, or the second dopant material 505 and the first dopant material 130 may include different dopant atoms.

The second dopant 505 may be implanted into the semiconductor structure 100 according to any suitable implantation operation. For example, the backside 150 may be exposed to an ionized gas that includes the second dopant 505. Ionized particles of the second dopant 505 may be accelerated by electric fields to high energies that may allow the ions of the second dopant 505 to be shot into the semiconductor structure 100. In this way, the ions of the second dopant 505 may have enough kinetic energy so that they can penetrate into the semiconductor structure 100 upon impact. Furthermore, the ions of the second dopant 505 may be formed into a beam of ions, which may be focused to a target location of the semiconductor structure 100 (e.g., one or more portions of the backside 150 of the semiconductor structure 100). A depth at which the second dopant 505 is implanted into the semiconductor structure 100 may be application specific, and various factors affecting the depth of implantation (e.g., dopant dosage levels, energy levels, beam incident angle, temperature, rotation, time of exposure to the ionized gas, etc.) may be chosen according to one or more design choices or empirical studies. In various embodiments, the implantation process may use a relatively low energy level in order to minimize impact to adjacent devices. In some embodiments, a thickness of a region including the second dopant 505 may be in the range of about 0.1 nm to 50 nm. The implantation process may be performed using any suitable ion implanter device.

In some embodiments, the concentration of second dopant 505 in the doped sub-fin region 120 may be greater proximate to the backside 150 than in a middle portion 145 of the doped sub-fin region 120 and/or the top-fin region 115. For example, the second dopant 505 may be at its highest concentration at or proximate to the backside 150 and/or the exposed surface of the sub-fin region 120, and the second dopant 505 may be at its lowest concentration in the middle portion 145 of the sub-fin region 120. The term "middle portion" may refer to a region or area of the fin 105 and/or the sub-fin region 120 that is between opposing side surfaces of the sub-fin region 120. Furthermore, although FIG. 5 shows that the second dopant 505 is implanted into a portion of the sub-fin region 120, the example embodiments are not limited thereto. In some embodiments, the second dopant 505 may be infused into an entirety of the sub-fin region 120 such that at least some second dopant 505 reaches or is infused into the first dopant material 130.

Furthermore, in various embodiments, mask 515 and/or resist 510 layers may be formed on portions of the backside 150 prior to the implantation process. The depiction of the arrangement of the resist 510 and the mask 515 in FIG. 5 should be taken as being illustrative in nature, and not limited to the scope of the disclosure. For example, in various embodiments, one of the resist 510 or the mask 515 may be omitted.

In embodiments where a mask is used, the mask 515 may be formed on the surface of the backside 150 or a portion thereof. A mask (also referred to as a "hard mask" or "hardmask") may be a material (or combination of materials) that may reduce or prevent the second dopant 505 from being implanted into selected areas of the semiconductor structure 100. For example, as shown by FIG. 5, the second dopant 505 is shown as being on top of the resist 510, which illustrates that the second dopant 505 has not been implanted into portions of the backside 150 where the mask 515 and/or the resist 510 are formed. Mask materials may be used in applications, such as high-aspect-ratio devices, where typical photoresist (e.g., resist 510), polymeric mask, or other like soft masks may be rapidly degraded during plasma etching. The mask 515 may be formed using any suitable technique or techniques. In some examples, mask 515 may be formed via a deposition operation using a spin-on operation or a vapor phase method, such as plasma exposure, atomic layer deposition (ALD), molecular layer deposition (MLD), chemical vapor deposition (CVD), and the like. In various embodiments, the mask 515 may be formed of any suitable material, such as silicon nitride (SiN), silicon oxynitride (SiON), titanium nitride (TiN), a carbon based hardmask, and the like. A thickness of the mask 515 may be based on the amount of time that the deposition operation is performed. In various embodiments, the mask 515 may be formed to have a thickness of approximately 1 nanometer (nm) to approximately 5 nm.

In embodiments where a resist layer is used, the resist 510 may be formed on the surface of the mask 515 and/or the backside 150 or a portion thereof. For example, the semiconductor structure 100 may be covered with a resist using a spin-on coating operation that is the same or similar to the spin-on operations described previously. The semiconductor structure 100 may be baked to drive off evaporate excess resist material, and thereafter, the second dopant 505 may be implanted into the backside 150 through the resist pattern as discussed previously. In various embodiments, resist 510 may be any suitable resist material, such as a photoresist material or other like "soft" material.

After the dopant implantation process, ions of the second dopant 505 may disrupt a crystal structure/lattice of the semiconductor structure 100 thereby creating a region of crystal damage and possibly an amorphous layer, which may be electrically inactive because the dopant 505 may not have become part of a crystal structure/lattice. An annealing process may be performed to rearrange the crystal structure/lattice such that the second dopant 505 may be electrically active. Such an annealing process is described with regard to FIG. 6 and operation 600.

Figure 6:
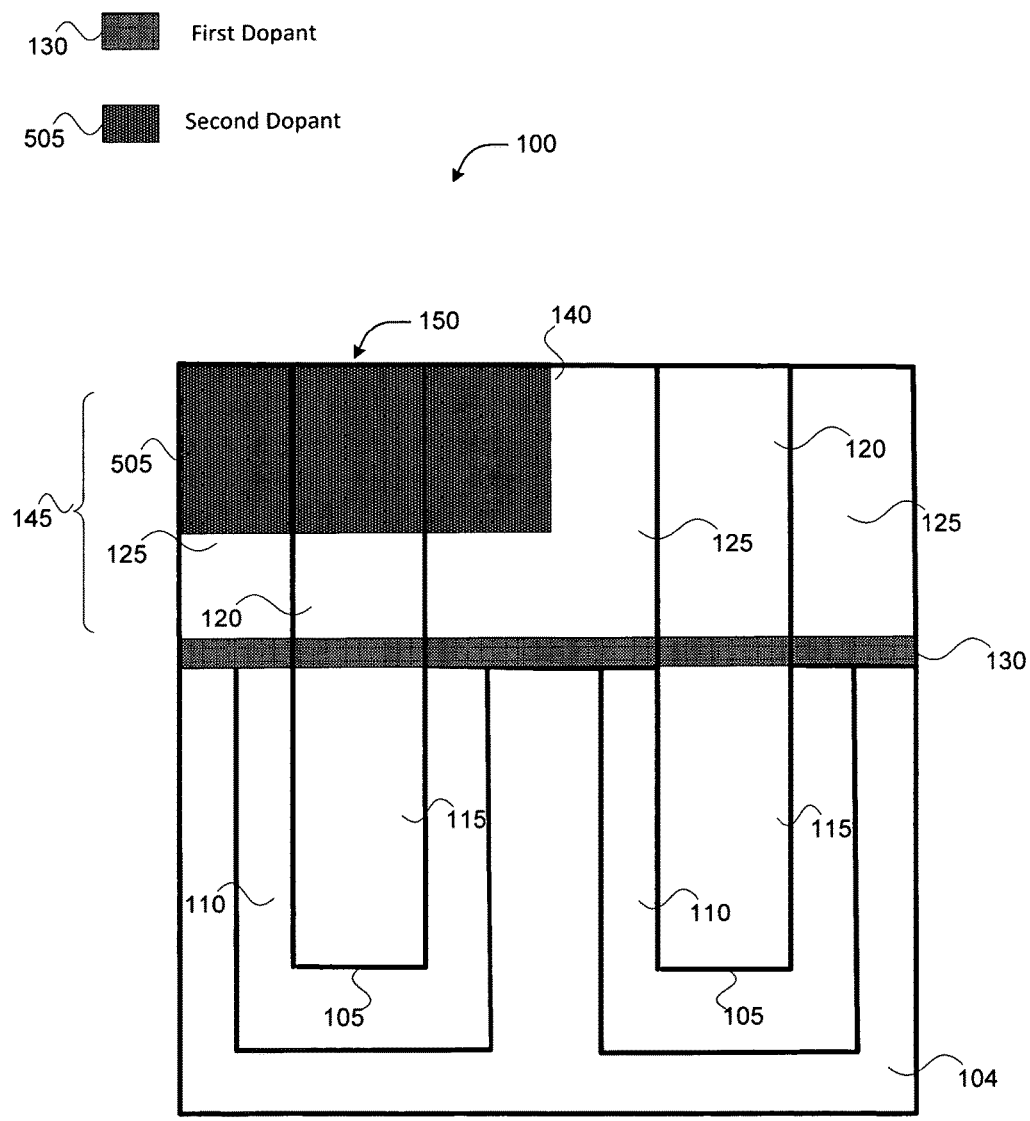

Referring to FIGS. 2 and 6, process 200 may proceed to operation 600, to perform an annealing process to activate the second dopant 505. The annealing process may be performed so that dopant atoms can replace silicon atoms at least in the sub-fin region 120, which may result in changes in the electrical properties of the sub-fin region 120 and/or the semiconductor structure 100. The annealing process may be any suitable annealing process, such as rapid thermal processing (RTP), a furnace annealing process, flash annealing lamp (FLA) process, an ultra-shallow implant anneal using a short wavelength flash light source, a laser annealing process, or a nitrogen or forming gas annealing process, and the like. In various embodiments, the temperature of such an annealing process may be any suitable temperature such as a temperature in the range of approximately 500° C. to approximately 1100° C.

Furthermore, as shown by FIG. 6, process 200 may also include etching off the any excess second dopant 505 and/or the mask 515 using any one or more of the previously mentioned etching processes (not shown in FIG. 2). The process 200 may also include exposing the resist 510 to light (e.g., ultraviolet light) or some other type of radiation. In embodiments, the resist 510 may be exposed to light through a photomask that includes a desired pattern. The resist may then be removed using a suitable solvent or otherwise stripped off the backside 150. The aforementioned etching and/or light exposure operations may be performed before or after the annealing operation.

In other embodiments, the process 200 may optionally include depositing a dielectric material or other any other suitable material on the backside 150 (not shown), and may be polished to smooth out the surface (not shown). The dielectric material (or other suitable material) may be patterned using any of the aforementioned etch processes to form source/drain contact openings (not shown). In such embodiments, the source/drain contact openings may include relatively deep openings, and may comprise a depth of about 20 nm to about 300 nm. The source/drain contact openings may be filled with one or more conductive materials to form one or more source/drain contacts (not shown). In embodiments, the one or more source/drain contacts may comprise self-aligned backside vias, and may comprise a height of about 40 nm to about 500 nm, in an embodiment. The one or more source/drain contacts may comprise conductive materials such as copper, tungsten, cobalt, titanium, and/or any other suitable material.

As discussed, process 200 may be implemented to fabricate a semiconductor structure 100 that may be used to fabricate one or more transistor structures. Any one or more of the operations of process 200 (or the operations discussed herein with respect to FIGS. 1 and 3-6) may be undertaken in response to instructions provided by one or more computer program products. Such program products may include signal bearing media providing instructions that, when executed by, for example, a processor, may provide the functionality described herein. The computer program products may be provided in any form of computer readable medium. Thus, for example, a processor including one or more processor core(s) may undertake one or more of the described operations in response to instructions conveyed to the processor by a computer readable medium.

Furthermore, any one or more of the operations of process 200 (or the operations discussed herein with respect to FIGS. 1 and 3-6) may be undertaken to form various semiconductor devices, such as transistor devices, memory devices, and/or the like. Such semiconductor devices may have at least one semiconductor structure comprising a plurality of fins disposed on a substrate wherein individual fins of the plurality of fins are laterally separated from other fins of the plurality of fins, individual fins of the plurality of fins extend away from the substrate, and individual fins of the plurality of fins comprise a doped sub-fin region that is disposed on the substrate and an undoped top-fin region disposed on the sub-fin region. Additionally, systems, apparatuses or devices may be formed that include a semiconductor substrate and one or more integrated circuit structures coupled to (for example, on and/or within the semiconductor substrate) the semiconductor substrate such that the one or more integrated circuit structures are fabricated using techniques discussed herein. Such semiconductor devices and/or integrated circuit structures may be further fabricated and/or otherwise integrated into platforms and/or computing devices as discussed herein with respect to FIGS. 7-10.

Figure 7:
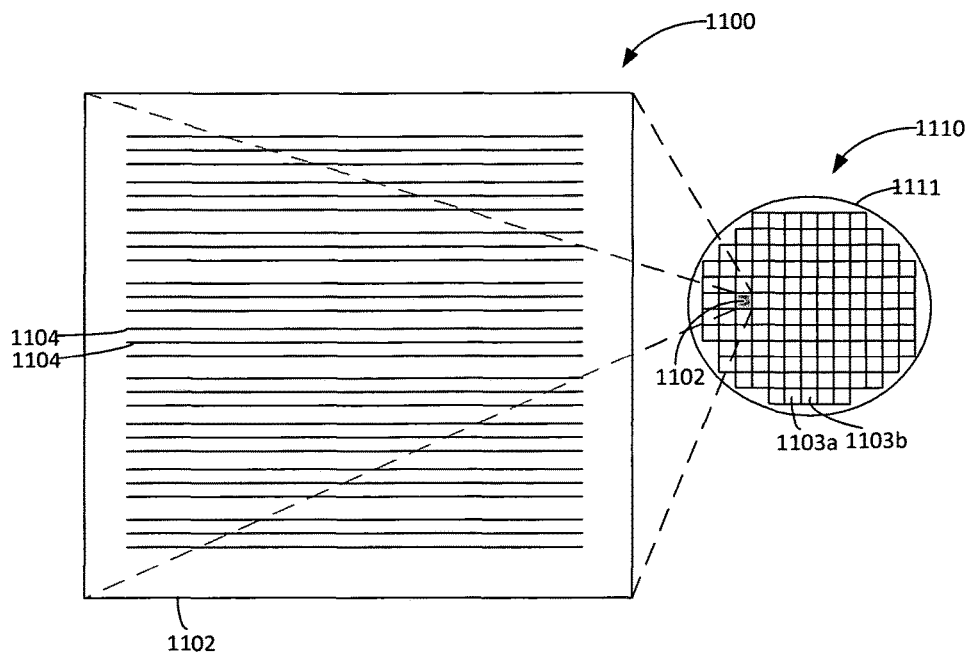
FIG. 7 schematically illustrates a top view of an example die in wafer form and in singulated form, in accordance with some embodiments.

FIG. 7 schematically illustrates a top view of an example die 1102 in wafer form 1110 and in singulated form 1100, in accordance with some embodiments. In some embodiments, the die 1102 may be one of a plurality of dies (e.g., dies 1102, 1103a, 1103b) of a wafer 1111 composed of semiconductor material such as, for example, silicon or other suitable material. The plurality of dies may be formed on a surface of the wafer 1111. Each of the dies may be a repeating unit of a semiconductor product that includes one or more transistor electrode assemblies (e.g., transistor electrode assemblies including semiconductor structure 100s formed according to the example embodiments) as described herein. For example, the die 1102 may include circuitry having transistor structures 1104 such as, for example, one or more channel bodies (e.g., fin structures, nanowires, planar bodies, etc.) that provide a channel pathway for mobile charge carriers of one or more transistor devices or source/drain regions. Electrical interconnect structures such as, for example, transistor electrode assemblies (e.g., terminal contacts) may be formed on and coupled with the one or more transistor structures 1104 to route electrical energy to or from the transistor structures 1104. For example, terminal contacts may be electrically coupled with a channel body to provide a gate electrode for delivery of a threshold voltage and/or a source/drain current to provide mobile charge carriers for operation of a transistor device. Although the transistor structures 1104 are depicted in rows that traverse a substantial portion of the die 1102 in FIG. 11 for the sake of simplicity, it is to be understood that the transistor structures 1104 may be configured in any of a wide variety of other suitable arrangements on the die 1102 in other embodiments, including, for example, vertical and horizontal features having much smaller dimensions than depicted.

After a fabrication process of the semiconductor product embodied in the dies is complete, the wafer 1111 may undergo a singulation process in which each of the dies (e.g., die 1102) is separated from one another to provide discrete "chips" of the semiconductor product. The wafer 1111 may be any of a variety of sizes. In some embodiments, the wafer 1111 has a diameter ranging from about 25.4 mm to about 450 mm. The wafer 1111 may include other sizes and/or other shapes in other embodiments. According to various embodiments, the transistor structures 1104 may be disposed on a semiconductor substrate in wafer form 1110 or singulated form 1100. The transistor structures 1104 described herein may be incorporated in a die 1102 for logic or memory, or combinations thereof. In some embodiments, the transistor structures 1104 may be part of a system-on-chip (SoC) assembly.

Figure 8:
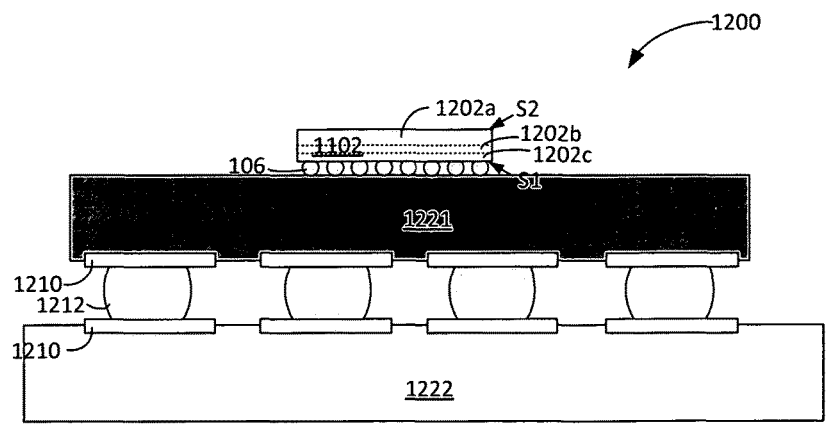
FIG. 8 schematically illustrates a cross-section side view of an integrated circuit (IC) assembly, in accordance with some embodiments.

FIG. 8 schematically illustrates a cross-section side view of an integrated circuit (IC) assembly 1200, in accordance with some embodiments. In some embodiments, the IC assembly 1200 may include one or more dies (hereinafter "die 1102") electrically and/or physically coupled with a package substrate 1221. In some embodiments, the package substrate 1221 may be electrically coupled with a circuit board 1222, as can be seen. In some embodiments, an integrated circuit (IC) assembly 1200 may include one or more of the die 1102, package substrate 1221 and/or circuit board 1222, according to various embodiments. Embodiments described herein for a transistor electrode assembly may be implemented in any suitable IC device according to various embodiments.

The die 1102 may represent a discrete product made from a semiconductor material (e.g., silicon) using semiconductor fabrication techniques such as thin film deposition, lithography, etching and the like used in connection with forming CMOS devices. In some embodiments, the die 1102 may be, include, or be a part of a processor, memory, SoC or ASIC. In some embodiments, an electrically insulative material such as, for example, molding compound or underfill material (not shown) may encapsulate at least a portion of the die 1102 and/or die-level interconnect structures 106.

The die 1102 can be attached to the package substrate 1221 according to a wide variety of suitable configurations including, for example, being directly coupled with the package substrate 1221 in a flip-chip configuration, as depicted. In the flip-chip configuration, an active side, S1, of the die 1102 including circuitry is attached to a surface of the package substrate 1221 using die-level interconnect structures 106 such as bumps, pillars, or other suitable structures that may also electrically couple the die 1102 with the package substrate 1221. The active side S1 of the die 1102 may include active devices such as, for example, transistor devices. An inactive side, S2, may be disposed opposite to the active side S1, as can be seen.

The die 1102 may generally include a semiconductor substrate 1202a, one or more device layers (hereinafter "device layer 1202b") and one or more interconnect layers (hereinafter "interconnect layer 1202c"). The semiconductor substrate 1202a may be substantially composed of a bulk semiconductor material such as, for example silicon, in some embodiments. The device layer 1202b may represent a region where active devices such as transistor devices are formed on the semiconductor substrate. The device layer 1202b may include, for example, transistor structures such as channel bodies and/or source/drain regions of transistor devices. The interconnect layer 1202c may include interconnect structures (e.g., electrode terminals) that are configured to route electrical signals to or from the active devices in the device layer 1202b. For example, the interconnect layer 1202c may include horizontal lines (e.g., trenches) and/or vertical plugs (e.g., vias) or other suitable features to provide electrical routing and/or contacts.

In some embodiments, the die-level interconnect structures 106 may be electrically coupled with the interconnect layer 1202c and configured to route electrical signals between the die 1102 and other electrical devices. The electrical signals may include, for example, input/output (I/O) signals and/or power/ground signals that are used in connection with operation of the die 1102.

In some embodiments, the package substrate 1221 is an epoxy-based laminate substrate having a core and/or build-up layers such as, for example, an Ajinomoto Build-up Film (ABF) substrate. The package substrate 1221 may include other suitable types of substrates in other embodiments including, for example, substrates formed from glass, ceramic, or semiconductor materials.

The package substrate 1221 may include electrical routing features configured to route electrical signals to or from the die 1102. The electrical routing features may include, for example, pads or traces (not shown) disposed on one or more surfaces of the package substrate 1221 and/or internal routing features (not shown) such as, for example, trenches, vias or other interconnect structures to route electrical signals through the package substrate 1221. For example, in some embodiments, the package substrate 1221 may include electrical routing features such as pads (not shown) configured to receive the respective die-level interconnect structures 106 of the die 1102.

The circuit board 1222 may be a printed circuit board (PCB) composed of an electrically insulative material such as an epoxy laminate. For example, the circuit board 1222 may include electrically insulating layers composed of materials such as, for example, polytetrafluoroethylene, phenolic cotton paper materials such as Flame Retardant 4 (FR-4), FR-1, cotton paper and epoxy materials such as CEM-1 or CEM-3, or woven glass materials that are laminated together using an epoxy resin prepreg material. Interconnect structures (not shown) such as traces, trenches, or vias may be formed through the electrically insulating layers to route the electrical signals of the die 1102 through the circuit board

1222. The circuit board 1222 may be composed of other suitable materials in other embodiments. In some embodiments, the circuit board 1222 is a motherboard (e.g., motherboard 1402 of FIG. 14).

Package-level interconnects such as, for example, solder balls 1212 may be coupled to one or more pads (hereinafter "pads 1210") on the package substrate 1221 and/or on the circuit board 1222 to form corresponding solder joints that are configured to further route the electrical signals between the package substrate 1221 and the circuit board 1222. The pads 1210 may be composed of any suitable electrically conductive material such as metal including, for example, nickel (Ni), palladium (Pd), gold (Au), silver (Ag), copper (Cu), and combinations thereof. Other suitable techniques to physically and/or electrically couple the package substrate 1221 with the circuit board 1222 may be used in other embodiments.

The IC assembly 1200 may include a wide variety of other suitable configurations in other embodiments including, for example, suitable combinations of flip-chip and/or wire-bonding configurations, interposers, multi-chip package configurations including system-in-package (SiP) and/or package-on-package (PoP) configurations. Other suitable techniques to route electrical signals between the die 1102 and other components of the IC assembly 1200 may be used in some embodiments.

Figure 9:
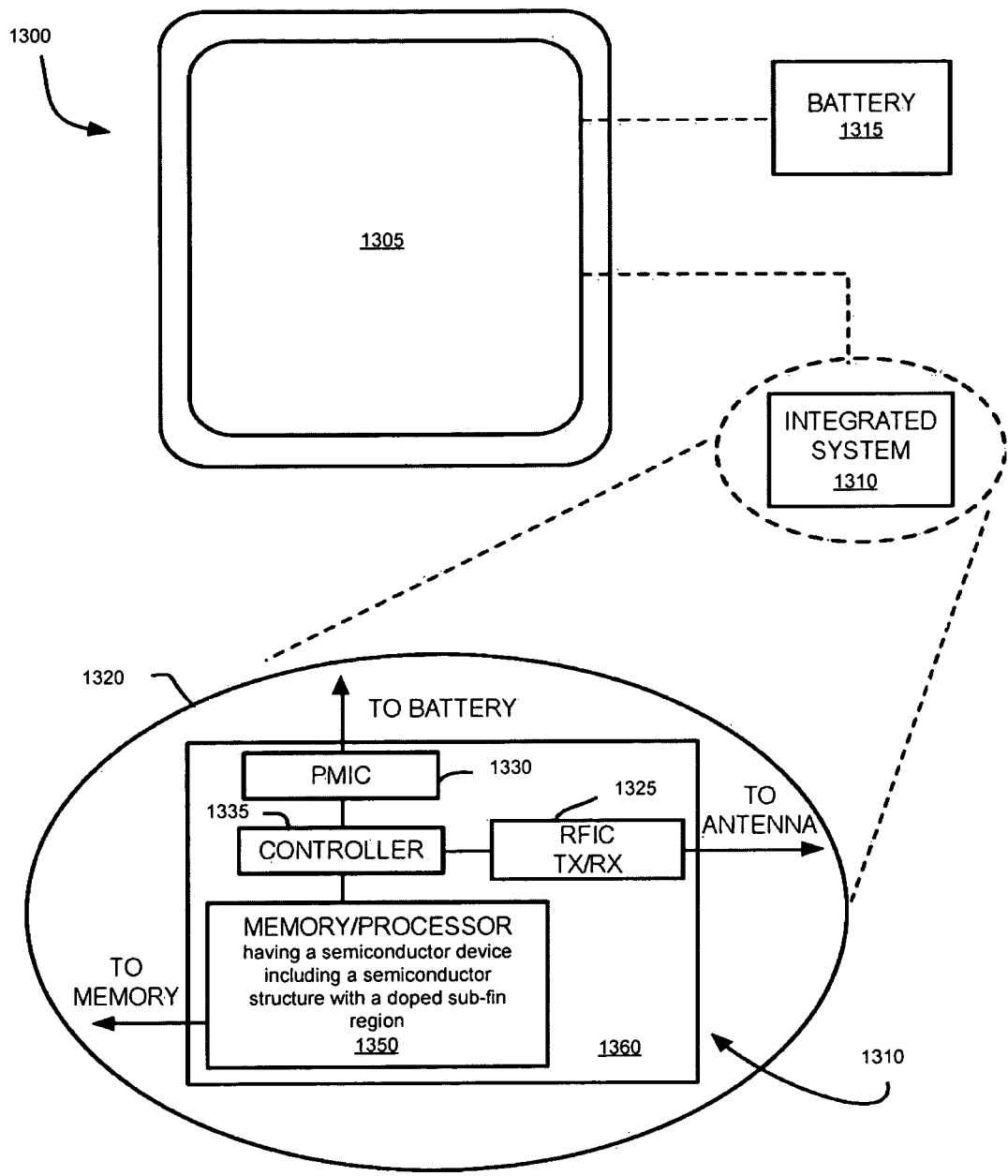
FIG. 9 is an illustrative diagram of a mobile computing platform employing an IC with transistor(s) fabricated according to the various example embodiments disclosed here.

FIG. 9 is an illustrative diagram of a mobile computing platform 1300 employing one or more integrated circuits (ICs) with a semiconductor device including at least one semiconductor structure 100 fabricated via the selective sub-fin doping techniques disclosed herein. For example, a transistor fabricated or formed via the sub-fin doping techniques discussed herein may be included in one or more ICs implemented by the mobile computing platform 1300. Mobile computing platform 1300 may be any portable device configured for one or more of electronic data display, electronic data processing, wireless electronic data transmission, or the like. For example, mobile computing platform 1300 may be any of a tablet, a smart phone, a netbook, a laptop computer, etc. and may include a display screen 1305, which in the exemplary embodiment is a touchscreen (e.g., capacitive, inductive, resistive, etc. touchscreen), a chip-level (SoC) or package-level integrated system 1310, and a battery 1315.

Integrated system 1310 is further illustrated in the expanded view 1120. In the exemplary embodiment, packaged device 1350 (labeled "Memory/Processor" in FIG. 11) includes at least one memory chip (e.g., RAM), and/or at least one processor chip (e.g., a microprocessor, a multi-core microprocessor, or graphics processor, or the like). In an embodiment, the package device 1350 is a microprocessor coupled to an SRAM cache memory. In some examples, one or both of the at least one memory and the at least one processor chip includes transistor(s) fabricated via the selective sub-fin doping techniques discussed herein. For example, a transistor of one or both of the processor or memory may include a semiconductor structure 100 with a doped sub-fin region and/or other features as discussed herein. Packaged device 1350 may be further coupled to (e.g., communicatively coupled to) a board, a substrate, or an interposer 1360 along with, one or more of a power management integrated circuit (PMIC) 1330, radio frequency (RF) (wireless) integrated circuit (RFIC) 1325 including a wideband RF (wireless) transmitter and/or receiver (TX/RX) (for example, including a digital baseband and an analog front end module further comprises a power amplifier on a transmit path and a low noise amplifier on a receive path), and a controller thereof 1335. In general, packaged device 1350 may be also be coupled to (for example, communicatively coupled to) display screen 1305.

Functionally, PMIC 1330 may perform battery power regulation, direct current (DC)-to-DC conversion, etc., and so has an input coupled to battery 1315 and with an output providing a current supply to other functional modules. In an embodiment, PMIC 1330 may perform high voltage operations. As further illustrated, in the exemplary embodiment, RFIC 1325 has an output coupled to an antenna (not shown by FIG. 13) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. In alternative implementations, each of these board-level modules may be integrated onto separate ICs coupled to the package substrate of packaged device 1350 or within a single IC (e.g., System-on-Chip (SoC)) coupled to the package substrate of the packaged device 1350.

Figure 10:
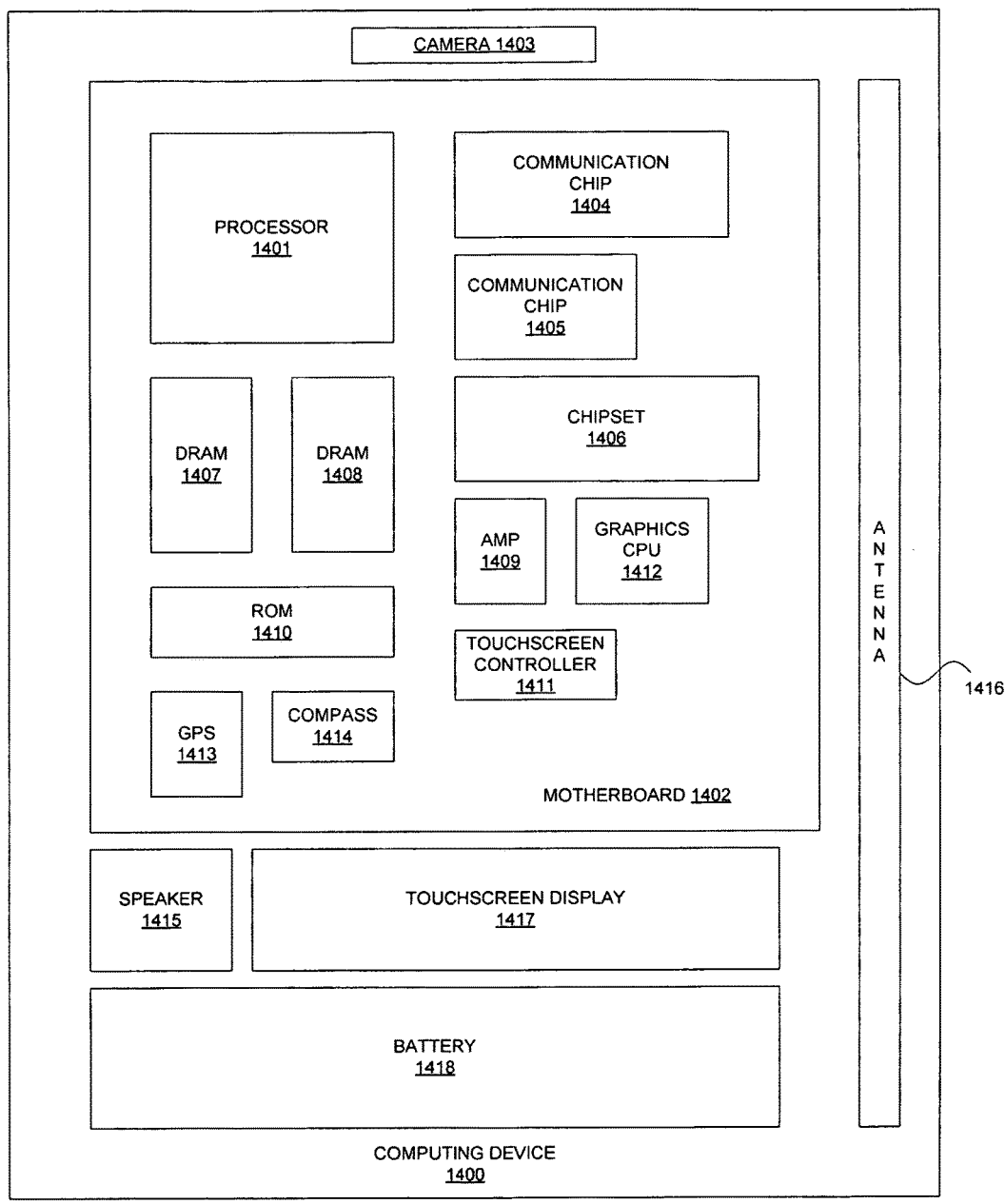
FIG. 10 is a functional block diagram of a computing device, arranged in accordance with at least some implementations of the present disclosure.

FIG. 10 is a functional block diagram of a computing device 1400, arranged in accordance with at least some implementations of the present disclosure. Computing device 1400 may be found inside platform 1300, for example, and further includes a motherboard 1402 hosting a number of components, such as but not limited to a processor 1401 (e.g., an applications processor) and one or more communications chips 1404, 1405. Processor 1401 may be physically and/or electrically coupled to motherboard 1402. In some examples, processor 1401 includes an integrated circuit die packaged within the processor 1401. In general, the term "processor" may refer to any device or portion of a device that processes electronic data from registers and/or memory to transform that electronic data into other electronic data that may be stored in registers and/or memory.

In various examples, one or more communication chips 1404, 1405 may also be physically and/or electrically coupled to the motherboard 1402. In further implementations, communication chips 1404 may be part of processor 1401. Depending on its applications, computing device 1400 may include other components that may or may not be physically and electrically coupled to motherboard 1402. These other components may include, but are not limited to, volatile memory (e.g., DRAM) 1407, 1408, non-volatile memory (e.g., ROM) 1410, a graphics processor 1412, flash memory, global positioning system (GPS) device 1413, compass 1414, a chipset 1406, an antenna 1416, a power amplifier 1409, a touchscreen controller 1411, a touchscreen display 1417, a speaker 1415, a camera 1403, and a battery 1418, as illustrated, and other components such as a digital signal processor, a crypto processor, an audio codec, a video codec, an accelerometer, a gyroscope, a mass storage device (such as hard disk drive, solid state drive (SSD), compact disk (CD), digital versatile disk (DVD), and so forth), a Geiger counter, a gravimeter, a pressure sensor, a humidity sensor, a proximity sensor, and/or the like.

Communication chips 1404, 1405 may enables wireless communications for the transfer of data to and from the computing device 1400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 1404, 1405 may implement any of a number of wireless standards or protocols, including but not limited to those described elsewhere herein. As discussed, computing device 1400 may include a plurality of communication chips 1404, 1405. For example, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

As used in any implementation described herein, the term "module" refers to any combination of software, firmware and/or hardware configured to provide the functionality described herein. The software may be embodied as a software package, code and/or instruction set or instructions, and "hardware", as used in any implementation described herein, may include, for example, singly or in any combination, hardwired circuitry, programmable circuitry, state machine circuitry, and/or firmware that stores instructions executed by programmable circuitry. The modules may, collectively or individually, be embodied as circuitry that forms part of a larger system, for example, an integrated circuit (IC), system on-chip (SoC), and so forth.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

The following examples pertain to further embodiments.

Example 1 may include a method for doping a sub-fin region of a semiconductor structure, the method comprising: providing a semiconductor structure that comprises a substrate and a plurality of fins formed on the substrate, the plurality of fins having sub-fin regions adjacent to the substrate; removing the substrate to expose a portion of a sub-fin regions of the plurality of fins; and implanting a dopant into the exposed portion of the sub-fin regions.

Example 2 may include the method of example 1 and/or some other examples herein, wherein the portion of the semiconductor substrate is removed by one or more of chemical mechanical planarization (CMP), grinding, dry etch, or wet etch.

Example 3 may include the method of example 1 and/or some other examples herein, wherein removing the portion of the semiconductor substrate comprises: polishing a remaining portion of the semiconductor substrate to a desired thickness.

Example 4 may include the method of example 3 and/or some other examples herein, wherein polishing the remaining portion of the semiconductor substrate to the desired thickness includes revealing a trench bottom of the semiconductor structure.

Example 5 may include the method of example 3 and/or some other examples herein, wherein the polishing comprises polishing the remaining portion to the desired thickness without revealing a trench bottom of the semiconductor structure.

Example 6 may include the method of any one of examples 3-5 and/or some other examples herein, wherein the remaining portion of the semiconductor substrate is polished by chemical mechanical planarization (CMP) or a grinding operation.

Example 7 may include the method of any one of examples 1-5 and/or some other examples herein, wherein implanting the dopant comprises: performing an ion implantation process.

Example 8 may include the method of example 7 and/or some other examples herein, wherein a thickness of a region including the implanted dopant is 0.1 nanometers to about 20 nanometers.

Example 9 may include the method of example 7 and/or some other examples herein, wherein the ion implantation process comprises forming an ionized gas including the dopant; accelerating particles of the ionized gas using an electric field; focusing the particles of the ionized gas to a target location of a backside of the semiconductor structure; and performing an annealing operation to activate the dopant in the sub-fin regions.

Example 10 may include the method of any one of examples 1-5, further comprising: performing, after implanting the dopant material, an annealing process such that the dopant implanted into the exposed portion of the sub-fin regions becomes electrically active.

Example 11 may include the method of example 10 and/or some other examples herein, wherein the annealing process includes one or more of a flash annealing lamp (FLA) process, an ultra-shallow implant anneal process, a rapid thermal anneal (RTA) process, a laser annealing process, or a nitrogen gas annealing process.

Example 12 may include the method of example 10 and/or some other examples herein, further comprising: performing, before the annealing process, a patterning process to the exposed portion of the sub-fin regions.

Example 13 may include the method of example 10 and/or some other examples herein, wherein a concentration of dopant material deposited on to the sub-fin regions is greater proximate to a surface of the doped sub-fin regions than in a middle portion of the doped sub-fin regions.

Example 14 may include the method of example 1 and/or some other examples herein, wherein the dopant material includes one or more of boron, phosphorus, arsenic, antimony, or indium.

Example 15 may include the method of example 1 and/or some other examples herein, wherein the dopant is a second dopant, and prior to removing the portion of a semiconductor substrate, a first dopant is deposited or implanted into a portion of the sub-fin regions that is closer to an undoped top-fin region of the plurality of fins than a backside of the semiconductor substrate.

Example 16 may include a semiconductor device, comprising: a semiconductor structure including a plurality of fins, wherein at least a portion of the plurality of fins include a doped sub-fin region and an undoped top-fin region disposed on the sub-fin region, wherein the undoped top-fin region extends into a gate region of the semiconductor device, and wherein a concentration of dopant material in the doped sub-fin region is greater proximate to a backside of the semiconductor device than proximate to the undoped top-fin region.

Example 17 may include the semiconductor device of example 16 and/or some other examples herein, further comprising: a dielectric material that substantially covers the doped sub-fin region and the substrate.

Example 18 may include the semiconductor device of example 17 and/or some other examples herein, wherein the concentration of dopant material in the doped sub-fin region is greater proximate to a portion of the sub-fin region closer to the backside than in a middle portion of the doped sub-fin region.

Example 19 may include the semiconductor device of any one of examples 16-18 and/or some other examples herein, wherein a portion of the sub-fin region closer to the undoped top-fin region is doped with a first dopant material and the portion of the sub-fin region closer to the backside is doped with a second dopant material.

Example 20 may include the semiconductor device of example 19 and/or some other examples herein, wherein the sub-fin region is doped with one or more of boron, phosphorus, arsenic, antimony, indium, carbon, silicon, germanium, or fluorine.

Example 21 may include a computing device comprising: a memory device; and a processor coupled to the memory device, the processor including a semiconductor device comprising at least one semiconductor structure 100, the at least one semiconductor device including: a semiconductor structure including a plurality of fins wherein individual fins of the plurality of fins are laterally separated from other fins of the plurality of fins, wherein at least a portion of the plurality of fins include a doped sub-fin region and an undoped top-fin region disposed on the sub-fin region, wherein the undoped top-fin region extends into a gate region of the semiconductor device, and wherein a concentration of dopant material in the doped sub-fin region is greater proximate to a backside of the semiconductor device than proximate to the undoped top-fin region.

Example 22 may include the computing device of example 22 and/or some other examples herein, wherein the concentration of dopant material in the doped sub-fin region is greater proximate to a portion of the sub-fin region closer to the backside than in a middle portion of the doped sub-fin region.

Example 23 may include the computing device of example 22 and/or some other examples herein, wherein a portion of the sub-fin region closer to the undoped top-fin region is doped with a first dopant material and the portion of the sub-fin region closer to the backside is doped with a second dopant material.

Example 24 may include the computing device of example 21 and/or some other examples herein, wherein the doped sub-fin region includes one or more of: boron, phosphorus, arsenic, antimony, indium, carbon, silicon, germanium, or fluorine.

Example 25 may include the computing device of any one of examples 21 to 24 and/or some other examples herein, wherein the computing device is a mobile computing device including one or more of an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, and a camera.

Example 26 may include the computing device of any one of examples 21 to 25 and/or some other examples herein, wherein the semiconductor structure is formed by removing a portion of a semiconductor substrate that is coupled to a backside of the semiconductor structure to expose a portion of a sub-fin region of the semiconductor structure; implanting a dopant into the exposed portion of the sub-fin region; and performing an annealing operation to activate the dopant in the sub-fin region.

Example 27 may include the semiconductor structure of any one of examples 16-20 and/or some other examples herein, wherein the semiconductor structure is formed by removing a portion of a semiconductor substrate that is coupled to a backside of the semiconductor structure to expose a portion of a sub-fin region of the semiconductor structure; implanting a dopant into the exposed portion of the sub-fin region; and performing an annealing operation to activate the dopant in the sub-fin region.

It will be recognized that the invention is not limited to the embodiments so described, but can be practiced with modification and alteration without departing from the scope of the appended claims. For example, the above embodiments may include specific combination of features. However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. A method for doping a sub-fin region of a semiconductor structure, the method comprising:
   providing a semiconductor structure that comprises a semiconductor substrate and a plurality of fins formed on the semiconductor substrate, the plurality of fins having sub-fin regions adjacent to the substrate;
   removing a portion of the semiconductor substrate to expose a portion of the sub-fin regions of the plurality of fins; and
   implanting a dopant into the exposed portion of the sub-fin regions.

2. The method of claim 1, wherein the portion of the semiconductor substrate is removed by one or more of chemical mechanical planarization (CMP), grinding, dry etch, or wet etch.

3. The method of claim 1, wherein removing the portion of the semiconductor substrate comprises:
   polishing a remaining portion of the semiconductor substrate to a desired thickness.

4. The method of claim 3, wherein polishing the remaining portion of the semiconductor substrate to the desired thickness includes revealing a trench bottom of the semiconductor structure.

5. The method of claim 3, wherein the polishing comprises polishing the remaining portion to the desired thickness without revealing a trench bottom of the semiconductor structure.

6. The method of claim 3, wherein the remaining portion of the semiconductor substrate is polished by chemical mechanical planarization (CMP) or a grinding operation.

7. The method of claim 1, wherein implanting the dopant comprises:
   performing an ion implantation process.

8. The method of claim 7, wherein a thickness of a region including the implanted dopant is 0.1 nanometers to about 20 nanometers.

9. The method of claim 7, wherein the ion implantation process comprises
   forming an ionized gas including the dopant;
   accelerating particles of the ionized gas using an electric field;
   focusing the particles of the ionized gas to a target location of a backside of the semiconductor structure; and
   performing an annealing operation to activate the dopant in the sub-fin regions.

10. The method of claim 1, further comprising:
performing, after implanting the dopant material, an annealing process such that the dopant implanted into the exposed portion of the sub-fin regions becomes electrically active.

11. The method of claim 10, wherein the annealing process includes one or more of a flash annealing lamp (FLA) process, an ultra-shallow implant anneal process, a rapid thermal anneal (RTA) process, a laser annealing process, or a nitrogen gas annealing process.

12. The method of claim 10, further comprising:
performing, before the annealing process, a patterning process to the exposed portion of the sub-fin regions.

13. The method of claim 10, wherein a concentration of dopant material deposited on to the sub-fin regions is greater proximate to a surface of the doped sub-fin regions than in a middle portion of the doped sub-fin regions.

14. The method of claim 1, wherein the dopant material includes one or more of boron, phosphorus, arsenic, antimony, or indium.

15. The method of claim 1, wherein the dopant is a second dopant, and prior to removing the portion of a semiconductor substrate, a first dopant is deposited or implanted into a portion of the sub-fin regions that is closer to an undoped top-fin region of the plurality of fins than a backside of the semiconductor substrate.

16. A semiconductor device, comprising:
a semiconductor structure including a plurality of fins, wherein at least a portion of the plurality of fins include a doped sub-fin region and an undoped top-fin region disposed on the sub-fin region, wherein the undoped top-fin region extends into a gate region of the semiconductor device, and
wherein a concentration of dopant material in the doped sub-fin region is greater proximate to a backside of the semiconductor device than proximate to the undoped top-fin region.

17. The semiconductor device of claim 16, further comprising:
a dielectric material that substantially covers the doped sub-fin region and a substrate of the semiconductor structure.

18. The semiconductor device of claim 17, wherein the concentration of dopant material in the doped sub-fin region is greater proximate to a portion of the sub-fin region closer to the backside than in a middle portion of the doped sub-fin region.

19. The semiconductor device of claim 16, wherein a portion of the sub-fin region closer to the undoped top-fin region is doped with a first dopant material and the portion of the sub-fin region closer to the backside is doped with a second dopant material.

20. The semiconductor device of claim 19, wherein the sub-fin region is doped with one or more of boron, phosphorus, arsenic, antimony, indium, carbon, silicon, germanium, or fluorine.

21. A computer device comprising:
at least one memory device; and
at least one processor coupled to the at least one memory device, the at least one processor including a semiconductor device, the semiconductor device comprising at least one semiconductor structure,
wherein the at least one semiconductor structure includes a plurality of fins, wherein at least a portion of the plurality of fins include a doped sub-fin region and an undoped top-fin region disposed on the sub-fin region, wherein the undoped top-fin region extends into a gate region of the semiconductor device, and
wherein a concentration of dopant material in the doped sub-fin region is greater proximate to a backside of the semiconductor device than proximate to the undoped top-fin region.

22. The computer device of claim 21, wherein the concentration of dopant material in the doped sub-fin region is greater proximate to a portion of the sub-fin region closer to the backside than in a middle portion of the doped sub-fin region.

23. The computer device of claim 22, wherein a portion of the sub-fin region closer to the undoped top-fin region is doped with a first dopant material and the portion of the sub-fin region closer to the backside is doped with a second dopant material.

24. The computer device of claim 21, wherein the doped sub-fin region includes one or more of: boron, phosphorus, arsenic, antimony, indium, carbon, silicon, germanium, or fluorine.

25. The computer device of claim 21, wherein the computer device is a mobile computer device including one or more of one or more antennas, a display, a touchscreen display, a touchscreen controller, a battery, an audio codec, a video codec, a power amplifier, a global positioning system (GPS) device, a compass, a Geiger counter, an accelerometer, a gyroscope, a speaker, and a camera.

* * * * *